(12) United States Patent
Fiedler et al.

(10) Patent No.: US 7,649,309 B2
(45) Date of Patent: Jan. 19, 2010

(54) HIGHLY EFFICIENT STABLE OXYNITRIDE PHOSPHOR

(75) Inventors: Tim Fiedler, München (DE); Frank Jermann, München (DE)

(73) Assignee: Patent-Treuhand-Gesellschaft für elektrische Glühlampen mbH, Munich (DE)

( * ) Notice: Subject to any disclaimer, the term of this patent is extended or adjusted under 35 U.S.C. 154(b) by 681 days.

(21) Appl. No.: 11/256,567

(22) Filed: Oct. 21, 2005

(65) Prior Publication Data

US 2006/0103297 A1 May 18, 2006

(30) Foreign Application Priority Data

Oct. 21, 2004 (DE) .................. 10 2004 051 395

(51) Int. Cl.
*H01J 1/62* (2006.01)
*H01J 63/04* (2006.01)

(52) U.S. Cl. .................. 313/503; 313/498; 313/483; 313/512

(58) Field of Classification Search ......... 313/498–512, 313/483, 485; 257/98–100; 252/301.4 R
See application file for complete search history.

(56) References Cited

U.S. PATENT DOCUMENTS

| | | | |
|---|---|---|---|
| 4,810,938 A | 3/1989 | Johnson et al. | |
| 6,717,353 B1 | 4/2004 | Mueller et al. | |
| 2002/0137709 A1 | 9/2002 | Lin et al. | |
| 2006/0289878 A1* | 12/2006 | Brunner et al. | ......... 257/89 |
| 2007/0034885 A1* | 2/2007 | Braune et al. | ......... 257/98 |

FOREIGN PATENT DOCUMENTS

| | | |
|---|---|---|
| CA | 2066604 | 1/1992 |
| EP | 0 494 310 A1 | 7/1991 |
| EP | 1 411 558 A2 | 10/2003 |
| WO | WO 02/10374 A2 | 2/2002 |
| WO | WO 2004/030109 A1 | 4/2004 |
| WO | WO 2004/036962 A1 | 4/2004 |
| WO | WO 2004036962 A1 * | 4/2004 |
| WO | WO 2004/039915 A1 | 5/2004 |
| WO | WO 2005/030905 A1 | 4/2005 |

OTHER PUBLICATIONS

W.H. Zhu et al., "Phase relationships in the Sr-Si-O-N system", J. Mat. Sci. Lett. 13, pp. 560-562, 1994.
Cao et al., "Wuji Cailiao Xuebao", vol. 2, No. 54, JCPDS No. 44-0117, 1987.

* cited by examiner

*Primary Examiner*—Toan Ton
*Assistant Examiner*—Kevin Quarterman
(74) *Attorney, Agent, or Firm*—Cohen Pontani Lieberman & Pavane LLP

(57) ABSTRACT

Phosphor from the class of the oxynitridosilicates, having a cation M which is doped with divalent europium, and having the empirical formula $MSi_2O_2N_2$, where $M=Sr_{1-x-y}Ca_yEu_x$ where $0.3 \leq x+y \leq 0.725$, with a Ca/Eu ratio of >1, the oxynitridosilicate having an emission with a dominant wavelength in the range from 555 to 568 nm.

13 Claims, 13 Drawing Sheets

US 7,649,309 B2

HIGHLY EFFICIENT STABLE OXYNITRIDE PHOSPHOR

FIELD OF THE INVENTION

The invention is based on a highly efficient phosphor from the class of oxynitridosilicates. Furthermore, the invention relates to a light source produced using this phosphor and to a process for producing a phosphor of this type.

BACKGROUND OF THE INVENTION

A new type of phosphor is known from WO 2004/030109, WO 2004/036962 and WO 2004/039915, as well as EP 1 411 558. It consists of Eu— or Eu,Mn-coactivated oxynitridosilicate of formula $MSi_2O_2N_2$ (M=Ca, Sr, Ba).

The basic structure of the host lattice is known from "Phase Relationships in the Sr—Si—O—N system", W. H. Zhu et al., J. Mat. Sci. Lett. 13 (1994), pp. 560-562, where it is discussed in conjunction with ceramic materials. In this reference, it was established that this structure occurs in two modifications, namely a low-temperature phase X1 and a high-temperature phase X2. The low-temperature phase, referred to below as LT for short, is produced predominantly at approximately 1300° C., whereas the high-temperature phase, referred to below as HT for short, is increasingly produced at higher temperatures up to approximately 1600° C. However, the two phases are fundamentally difficult to separate, since they have the same basic structure but different lattice constants. The exact stoichiometry of the two phases may deviate from the formula $MSi_2O_2N_2$.

SUMMARY OF THE INVENTION

It is an object of the present invention to provide a phosphor which has a high efficiency and at the same time is distinguished by an excellent stability. A further object is to provide a process for producing this efficient phosphor. A further object is to provide a particularly stable phosphor for emission in the green to yellow spectral region and an associated light source.

These and other objects are attained in accordance with one aspect of the invention directed to a highly efficient, stable oxynitride phosphor from the class of the oxynitridosilicates with a cation M and the empirical formula $MSi_2O_2N_2$, where M simultaneously comprises as constituent Sr and Ca and also an activator D, where D at least includes divalent europium, characterized in that $M=Sr_{1-x-y}Ca_yEu_x$ where $0.3 \leq x+y \leq 0.725$, with a Ca/Eu ratio of >1, the oxynitridosilicate having an emission with a dominant wavelength in the range from 555 to 568 nm.

Hitherto, there has been no high-efficiency, green/yellow-emitting phosphor which is at the same time insensitive to external influences and, moreover, can be excited successfully by primary blue-emitting or UV-emitting light sources. Light sources of this type include in particular UV-emitting or blue-emitting LEDs of type InGaN or alternatively InGaAlP, and also discharge lamps which use phosphors, as known per se, in particular high-pressure discharge lamps which have a high color rendering index Ra or are based on indium lamps which can be operated either with high pressure or low pressure.

This phosphor is suitable in particular for the production of luminescence conversion LEDs with a green to yellow emission color based on a UV-emitting or blue-emitting LED, i.e. in particular where both InGaN and InGaAlP technology allow only low chip efficiencies. On account of its extraordinary radiation stability, however, it is also suitable as a stable green phosphor for discharge lamps, in particular for indium discharge lamps, and in particular as a stable green phosphor for discharge lamps with a high Ra, for example over Ra=90.

Hitherto, only a small number of phosphors have been suitable for conversion in particular into "pure green" (typical dominant wavelength from 555 to 563 nm). Hitherto, gallium-containing garnets or thiogallates have been suitable for use together with a blue LED. Hitherto, it has only been possible to use thiogallates for UV-pumped LEDs. However, on account of their wide emission, garnets only allow a low degree of color saturation. Thiogallates are chemically unstable and highly temperature-sensitive (quenching problem).

The phosphor $MSi_2O_2N_2$:Eu (M=Ca, Sr, Ba) which is known from WO 2004/030109, WO 2004/036962 and WO 2004/039915 as well as EP 1 411 558 behaves significantly differently according to the metal selected. Whereas if M=Ca the phosphor proves to be sufficiently radiation-stable, if M=Sr the stability is not satisfactory, since in this case the lattice has a different structure. It currently appears as if the color loci associated with the Sr Sion cannot be used directly or could only be used with additional measures (for example stabilization by coating). Surprisingly, however, it has been found that a suitably mixed Sion of the metals Ca and Sr approximately or completely has structural features and therefore the extraordinary stability of the Ca Sion but an emission similar to that of an Sr Sion. Consequently, a (Ca, Sr) mixed Sion can be used as a substitute for the pure Sr Sion.

Another aspect of the present invention is directed to a process for producing a highly efficient phosphor, characterized by the following process steps: a) providing the starting materials $SiO_2$, $Si_3N_4$, $SrCO_3$, $CaCO_3$ and the Eu precursor, in particular $Eu_2O_3$, in a substantially stoichiometric ratio, b) mixing the starting materials in a W or Mo crucible using a flux, and c) annealing the mixture at approximately 1300 to 1700° C., preferably 1500 to 1600° C.

This requires an annealing process which is carried out at at least 1300° C. but no more than 1700° C. A temperature range from approximately 1500 to 1600° C. is preferred, since at lower temperatures undesirable phases, such as orthosilicates, are increasingly formed and at higher temperatures the phosphor becomes increasingly difficult to process and above approximately 1700° C. is in the form of a hard-sintered ceramic or is molten. The optimum temperature range depends on the precise composition and properties of the starting materials.

A batch of the starting materials which is substantially stoichiometric using the base components $SiO_2$, $SrCO_3$ and $Si_3N_4$ is actually particularly important for the production of an efficient mixed Sion. Sr here represents M. The deviation should not exceed in particular 10%, preferably 5%, from the ideal stoichiometric batch, including the addition of any melting aid, which is often standard practice. The highest quantum efficiencies are achieved at a virtually exactly stoichiometric composition.

A mixed Sion from the class of the oxynitridosilicates with a cation M and the empirical formula $MSi_2O_2N_2$, where M simultaneously comprises, as constituents, Sr and Ca and also an activator D, D at least comprising divalent europium, where: $M=Sr_{1-x-y}Ca_yEu_x$ where $0.3 \leq x+y \leq 0.725$, with a Ca/Eu ratio >1, preferably Ca/Eu ratio >2 (since Ca is better stabilized than Eu), the oxynitridosilicate having an emission with a dominant wavelength in the range from 555 to 568 nm, has properties in accordance with the invention. The two ions $Ca^{2+}$ and $Eu^{2+}$ behave in similar ways with regard to their stabilizing effect, which justifies them being combined in the sum x+y. An oxynitridosilicate whereof the composition is adapted in such a way that the dominant wavelength is at most 565 nm is of particular interest.

It is preferable for the phosphor to have an Eu content of between 1 and 20 mol %, preferably 2 to 12 mol %, of M.

A phosphor which complies with the guideline x+y≧0.525 has an excellent stability under high loads.

Furthermore, it is beneficial to the stability of the phosphor if the Ca/Sr ratio is in the range 0.90<Ca/Sr<2.3, in particular in the range 0.95≦Ca/Sr≦1.2.

Some of the europium may be replaced by manganese, in which in particular up to 30 mol % of Eu is replaced by Mn.

Another aspect of the present invention relates to a light source having a primary radiation source which emits radiation in the short-wave region of the optical spectral region in the wavelength range from 140 to 480 nm (peak wavelength), this radiation being completely or partially converted into secondary radiation with a longer wavelength in the visible spectral region by means of at least one first phosphor in accordance with one of the above aspects.

For the light source, a light-emitting diode based on InGaN or InGaAlP or a discharge lamp working on a low pressure or high pressure basis or an electroluminescent lamp is particularly suitable as primary radiation source. This is to be understood in particular as encompassing fluorescent lamps or compact fluorescent lamps as well as mercury high-pressure lamps with improved color. Major advantages are found in particular in the case of indium-based fills for high-pressure discharge lamps and low-pressure discharge lamps.

In this case, some of the primary radiation can still be converted into radiation with a longer wavelength by means of a second phosphor, with the first and second phosphors in particular being selected and mixed in a suitable way to generate white light. Some of the primary radiation can also be converted into radiation with a longer wavelength by means of a third phosphor, this third phosphor emitting in the red spectral region.

A further aspect of the invention relates to a process for producing a highly efficient phosphor as described above. It is distinguished by the following process steps:

a) providing the starting materials $SiO_2$, $Si_3N_4$, $SrCO_3$, $CaCO_3$ and the Eu precursor, in particular $Eu_2O_3$ or EuN or $EuF_3$, in a substantially stoichiometric ratio;

b) mixing the starting materials in a W or Mo crucible using a flux;

c) annealing the mixture at approximately 1300 to 1700° C., preferably 1450 to 1650° C.

It has proven expedient for the flux to be selected from the group consisting of $HBO_3$, $CaF_2$, $SrF_2$ or $EuF_3$.

Furthermore, it has proven advantageous if the annealing of the mixed starting materials ("batch") is carried out in an $N_2/H_2$ mixture in which $H_2$ forms from 0 to 20% by volume.

With this phosphor, it is important to maintain a balance between a mixed Sion which is as close as possible to the properties of the actual pure Sr Sion and the discovery that as the Sr content decreases the peak emission moves ever further away from the emission of the pure Sr Sion; however, the higher the Ca content, the more stable the phosphor. On the other hand, if the Ca content is too high, the efficiency drops.

It is in this way possible in particular to provide a phosphor which forms an oxynitridosilicate of the ideal formula $MSi_2O_2N_2$ (M=Ca Sr) which is activated with divalent Eu, optionally with the further addition of Mn as coactivator. This phosphor is distinguished by the fact that it can be excited over a wide band, namely in a broad range from 250 to 480 nm, that it is extremely stable with respect to external influences, i.e. does not reveal any measurable degradation at 150° C. in air, and that it has an extremely good color locus stability under fluctuating conditions.

Further plus points are its low absorption in the red, which is advantageous in particular for phosphor mixtures. This phosphor is often referred to below as a mixed Sion.

This phosphor is in particular green-emitting with a dominant wavelength in the range from 555 to 565 nm.

It is also possible to add a small amount of AlO instead of SiN (in particular up to at most 30% of the SiN content).

The phosphor $MSi_2O_2N_2$:Eu where M=(Ca, Sr), or in other words $MSi_2O_2N_2$ where $M=Sr_{1-x-y}Ca_yEu_x$ where 0.3≦x+y≦0.725, in particular where y>0.45, has an XRD spectrum similar to the $CaO*Si_2N_2O$ which is known from the literature (JCPDS No. 44-0117, reference: Cao et al. Wuji Cailiao Xuebao 2, 54 (1987)), but this is distorted by the incorporation of the larger $Sr^{2+}$ ion. Unlike the phosphors which crystallize in the pure $SrO*Si_2N_2O$ structure, such as Sr—SiON:Eu, the novel phosphor surprisingly has an excellent stability under intensive UV or blue irradiation, in particular even after being subject to moisture. The other properties of the mixed Sion, in particular $(Ca_{0.475}Sr_{0.475})Si_2O_2N_2$:Eu(5%), are similar to those of the Sr Sion, and consequently the novel phosphor can replace Sr—SiON:Eu in many applications. The dominant wavelength is only shifted about 3-4 nanometers into the yellow compared to the Sr Sion. The dominant wavelength of 562 nm for $(Sr_{0.5}Ca_{0.5})Si_2O_2N_2$:Eu, at 5% Eu, is suitable for use a "pure green" converter. The stoichiometry which can be demonstrated on the end product may deviate by up to 20% from the ideal stoichiometry (222).

In particular, this phosphor can be efficiently excited by a wide range of light sources, including LEDs (for example of the InGaN type) which emit UV or blue as primary radiation. Furthermore, all types of lamps, in particular Hg low-pressure and high-pressure lamps, as well as UV and VUV radiators between approximately 140 and 480 nm, for example excimer radiators, are suitable. At 160 nm, the quantum efficiency is still approximately 50%. In particular, it can be used for indium-based discharge lamps.

This phosphor is also particularly suitable for applications with luminescence conversion LEDs which are suitable for full-color applications and luminescence conversion LEDs with colors which can be set as desired on the basis of an LED which primarily emits UV/blue.

A radiation-stable phosphor $Sr_{1-x-y}Ca_yEu_xSi_{2\pm\delta}O_{2\pm\delta}N_{2\pm\delta}$ with a dominant emission wavelength $\lambda_{dom}$>550 nm, in particular >555 nm, where $M=Sr_{1-x-y}Ca_yEu_x$ where 0.3≦x+y≦0.725 x+y<0.75, preferably x+y<0.55, has particularly good properties; δ<0.2 defines the typical uncertainty range for the stoichiometry, which may be relatively high with this phosphor. An important criterion to achieve an excellent stability is a Ca/Sr ratio of approximately 1 or greater.

This does not rule out the possibility of the phosphor containing traces of other elements, in particular rare earths, alkaline-earth metals, transition metals and W, Mo, Al, O, H, in low concentrations up to in each case 2000 ppm. This results in particular from contamination to the starting materials or the melting aid or originates from the crucible material.

A characteristic feature for a particularly suitable phosphor is that its structure leads to an XRD spectrum (derived from the standard Cu—Kα X-radiation) which for an angle 2 Θ between 31.6° and 32.4° at most has an intensity value for any line which can be detected of less than 40% of the maximum value of the closest reflection, and in particular does not include any maximum value of a line.

Another feature of a particularly stable phosphor is that its structure leads to an XRD spectrum which for an angle 2 Θ between 27.7° and 28.0° does not include any maximum value of a line (once again based on Cu—Kα X-radiation).

A particularly suitable phosphor is distinguished by the fact that three of the most intensive ten lines in the XRD spectrum of the phosphor are to be found in the following ranges of the angle 2 Θ (position of the maximum values with Cu—Kα X-radiation): 25.7°-26.2° and 32.6°-33.8° and 37.8°-38.3°.

A particularly efficient process for producing a phosphor according to the invention is based on a material mixture of $SrCO_3$, $CaCO_3$, $SiO_2$, $Si_3N_4$, $Eu_2O_3$ and a further flux, such as $HBO_3$ or other typical fluxes, among which preferably $CaF_2$, $SrF_2$ or $EuF_3$, is annealed in a W or Mo crucible at temperatures from 1300-1700° C.

The phosphor according to the invention can be used in particular for luminescence conversion LEDs for generating green or colored or white light in a manner known per se. By way of example, it is used for a white LED together with blue primary radiation, in which case the mixed Sion can be used as green component together with $SrS:Eu^{2+}$ as red component. However, it can also be used with UV primary radiation, in which case white light is generated by means of blue-emitting and red-emitting phosphors and green-emitting phosphors in accordance with the invention. Candidates for the blue component are known per se, including for example $BaMgAl_{10}O_{17}:Eu^{2+}$ (known as BAM) or $Ba_5SiO_4(Cl, Br)_6:Eu^{2+}$ or $CaLa_2S_4:Ce^{3+}$ or alternatively $(Sr, Ba, Ca)_5(PO_4)_3Cl:Eu^{2+}$ (known as SCAP). The phosphor according to the invention is suitable as a green component. A red phosphor can be used for the red emission. Suitable examples include $((Y,La,Gd,Lu)_2O_2S:Eu^{3+}$, or alternatively $(Ca, Sr)_2Si_5N_8:Eu^{2+}$ and $(Ca, Sr)_2Si_{5-x}Al_xN_{8-x}O_x:Eu^{2+}$ or $CaAlSiN_3:Eu$, as are known per se.

Various optimizations may be implemented depending on the particular application. For pure green applications, the Ca:Sr ratio should be in the vicinity of 1. For warm white applications, the Ca content may be relatively high. In general, the Eu content should be relatively high, with an optimum in the vicinity of 5 to 10%.

Comparing the stability of the phosphor according to the invention in an LED shows that with an Sr/Ca ratio in the vicinity of 1, a stability after 1000 hours which approximately corresponds to that of YAG:Ce, the most stable garnet phosphor of all which is known, is achieved, equating to a breakthrough in the stability properties for LED phosphors of other colors. By contrast, a pure Sr Sion has a stability after 1000 hours which reveals a relative loss of efficiency of approximately 20% compared to YAG:Ce.

BRIEF DESCRIPTION OF THE DRAWINGS

The invention is to be explained in more detail in the text which follows on the basis of a number of exemplary embodiments. In the drawing.

DETAILED DESCRIPTION OF THE DRAWINGS

Figure 1:
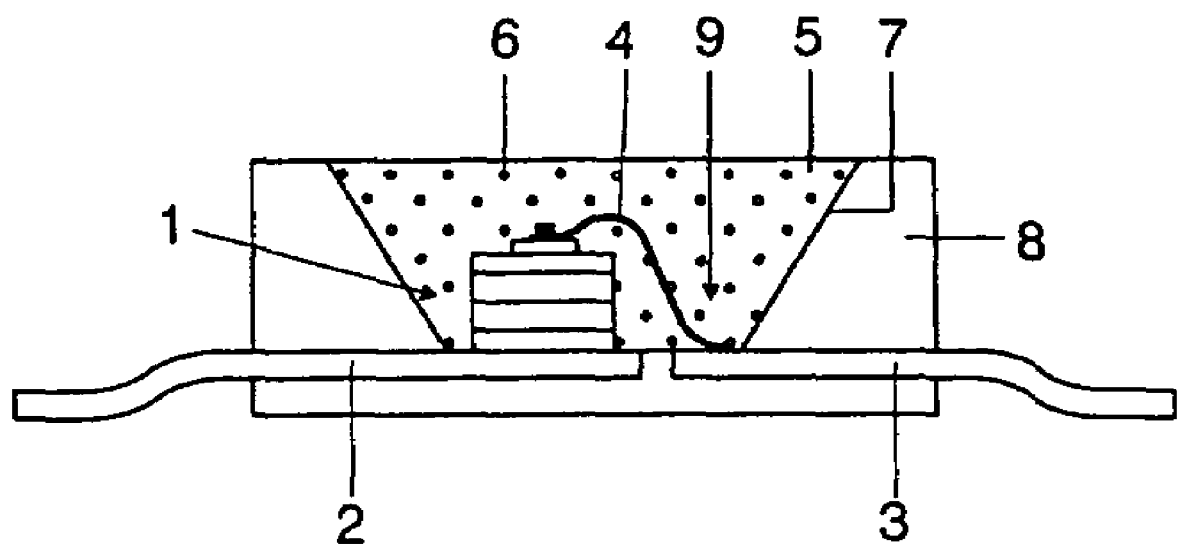
FIG. 1 shows an exemplary embodiment of a semiconductor component.

FIG. 1 specifically illustrates the structure of a light source for white light. The light source is a semiconductor component having a chip 1 of type InGaN or InGaAlP with a peak emission wavelength in the UV of, for example, 405 nm to 470 nm, respectively, which is embedded in an opaque basic housing 8 in the region of a recess 9. The chip 1 is connected to a first terminal 3 via a bonding wire 4 and to a second electrical terminal 2 directly. The recess 9 is filled with a potting compound 5, which as its main constituents contains an epoxy casting resin (80 to 90% by weight) and phosphor pigments 6 (less than 20% by weight). The recess has a wall 7 which serves as reflector for the primary and secondary radiation from the chip 1 or the pigments 6. The primary radiation from the UV-LED is completely converted into green by the phosphor. The phosphor used is the oxynitridosilicate described above.

Figure 2:
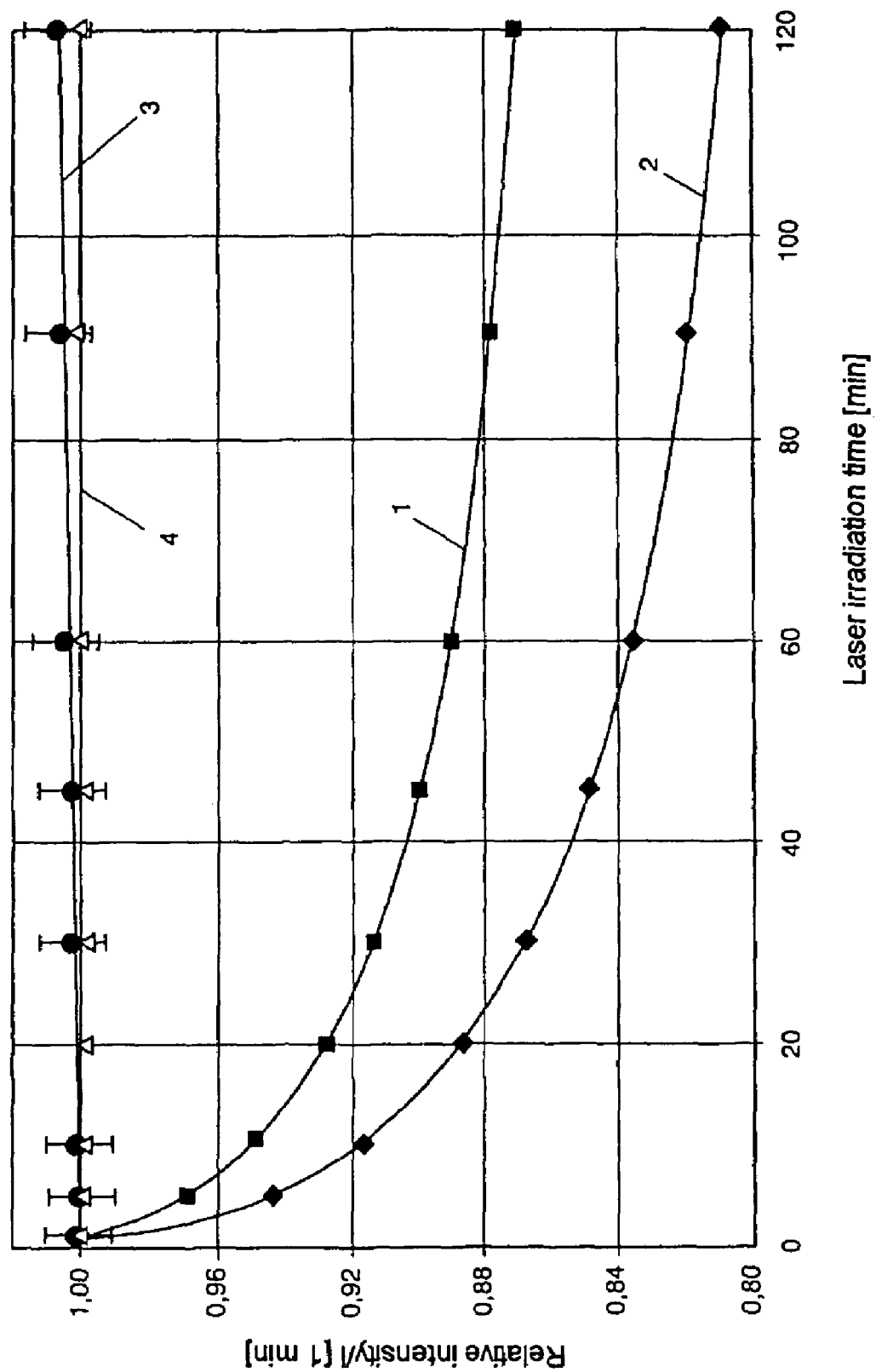
FIG. 2 shows the intensity properties of an oxynitridosilicate under strong irradiation.

FIG. 2 shows the extraordinary stability of the novel phosphor. This figure compares the relative intensity of two phosphors with one another. One phosphor is a conventional Sr Sion of type 222, $SrSi_2O_2N_2:Eu(5\%)$, the other is an (Sr, Ca) Sion according to the invention with Sr:Ca=1, i.e. a mixed Sion $(Sr_{0.5}Ca_{0.5})Si_2O_2N_2:Eu(5\%)$. The Sr Sion, on the one hand, and the mixed Sion, on the other hand, were first of all as synthesized (curves 1 and 3) subjected to intensive irradiation with a laser of wavelength 460 nm. After two hours, the intensity in the case of the Sr Sion dropped to 87% of the starting value, whereas the mixed Sion was not impaired at all. Then, the phosphor was in each case washed in order to simulate the effect of moisture. The subsequent further measurement of the intensity properties under strong laser irradiation revealed a clear deterioration in the Sr Sion, for which the intensity had dropped to approximately 80% after two hours. By contrast, the mixed Sion according to the invention also has an excellent resistance to moisture. It was not possible to determine any deterioration in the intensity.

The conclusion is that mixed Sions of this type are extremely radiation-stable and moisture-stable and are therefore ideally suited to all light sources with high radiation loading without the need for an expensive coating.

Figure 3:
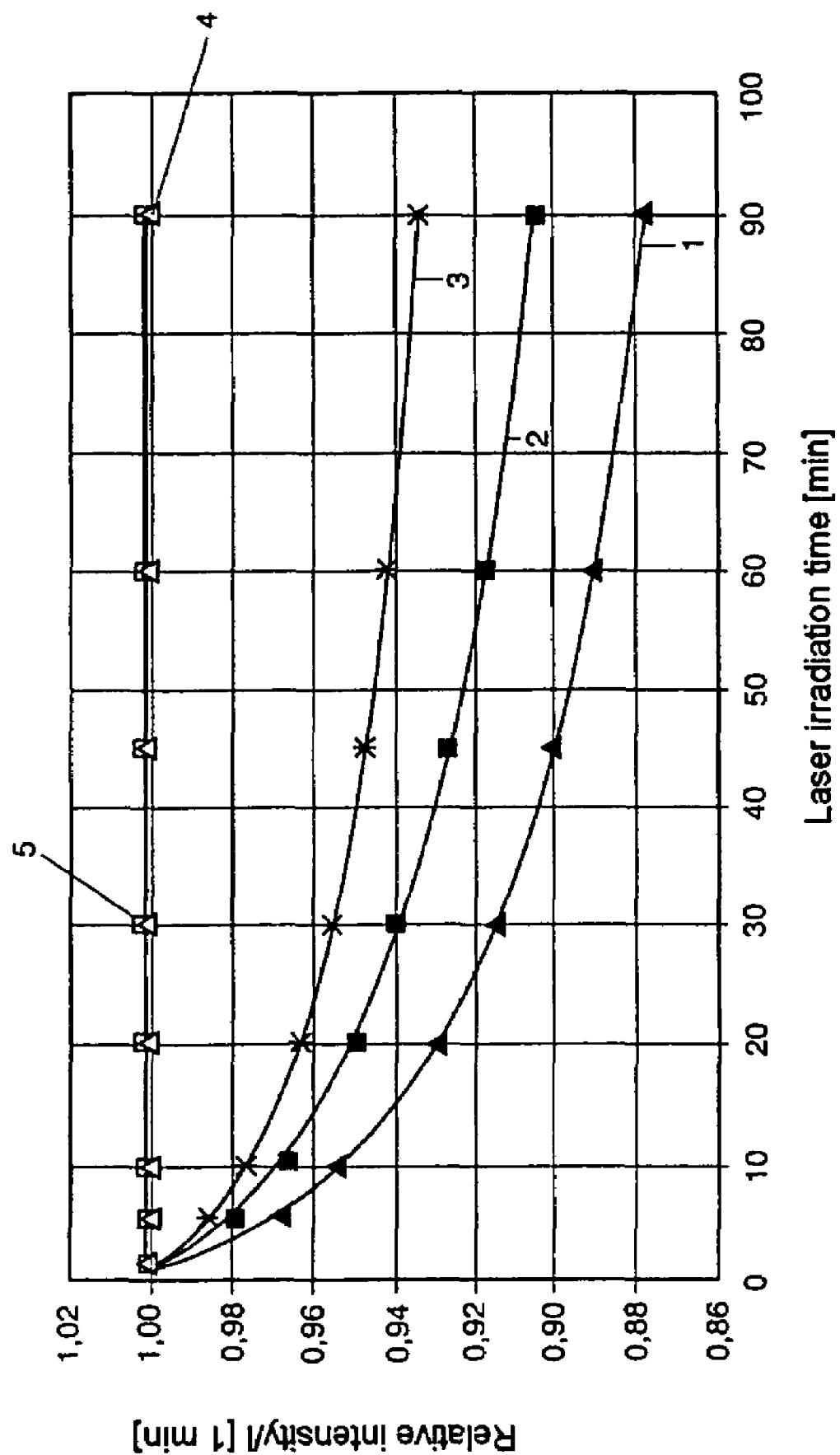
FIG. 3 shows the intensity properties of various oxynitridosilicates under strong irradiation.

This finding is confirmed by systematic investigation of mixed Sions with different Ca contents, cf. FIG. 3. Here once again the relative intensity of various mixed Sions under strong irradiation with a laser was tested over a prolonged period of time, with a doping of 5% Eu. It is found that a pure Sr Sion (1) has a very poor stability (drop to 88% after irradiation for 90 minutes). Addition of 27.5% of Ca instead of Sr (curve 2) improves the stability significantly, while the addition of 40% of Ca (curve 3) reveals even better values. Ideal stability can ultimately be achieved with a Ca:Sr ratio of 1:1, i.e. in this case a Ca content of 47.5% (curve 4). Any further increase in the Ca content maintains this high stability. One example is a Ca content of 67.5% (curve 5).

Figure 4:
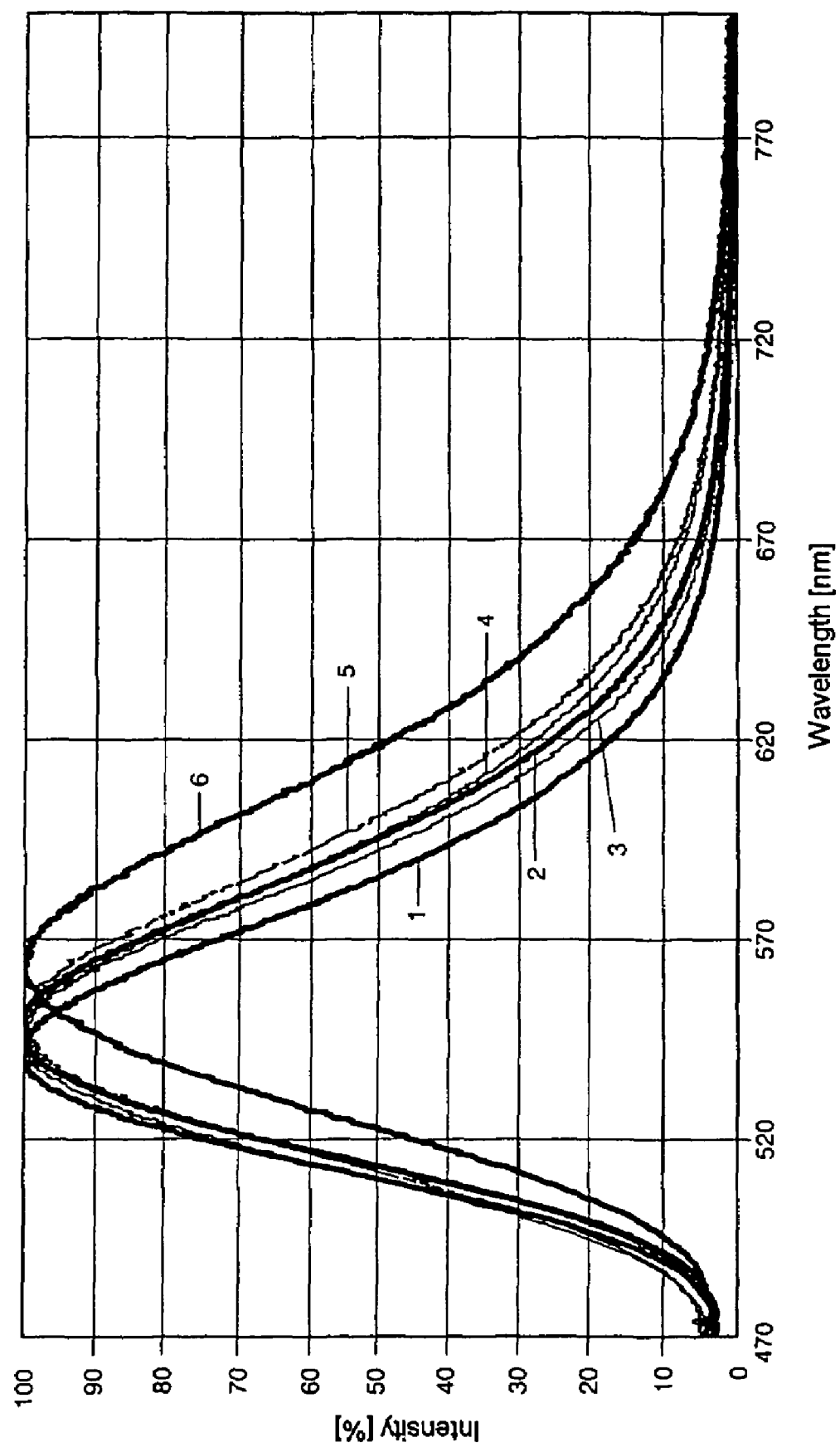
FIG. 4 shows an emission spectrum of various oxynitridosilicates.

The question of to what extent these highly stable mixed Sions can replace the unstable Sr Sion is answered by FIG. 4, which shows the emission of various mixed Sions together with that of Sr Sion and Ca Sion. Whereas the Sr Sion has a peak wavelength of approximately 545 nm, for Ca Sion it is approximately 565 nm. The peak wavelengths of the various mixed Sions are only slightly higher than that of the Sr Sion, provided that the Ca content selected is not too high. The limit is 67.5%, and consequently the limit for the total sum of Ca and Eu can be set at 72.5%. A higher content would shift the emission too close to that of the Ca Sion, so that a phosphor of this type could no longer be used specifically for green and warm-white applications, in which there has not hitherto been a sufficiently stable phosphor available.

Table 1 also indicates the dominant wavelength, which ultimately determines the usability, for various mixed Sions. The dominant wavelength for pure Sr Sion is from 558 to 563 nm, depending on the Eu doping; a low level of doping, if any doping is used at all, leads to even lower values down to approximately 555 nm. By contrast, the Ca Sion has a significantly longer wavelength, a value of over 570 nm being typical.

The color loci of the pure Sr Sion can be simulated or at least approached using various mixed Sions, which means that there is no need to use the unstable Sr Sions.

Here, by way of example, the characteristic reflection at 13° for the angle 2 Θ is absent altogether. Finally, FIG. 7c shows the $Sr_{0.5}Ca_{0.45}Eu_{0.05}Si_2N_2O_2$, which is already markedly improved with regard to the stability aspect. Both the wider Ca Sion reflection at approximately 32.5° and the narrower Sr Sion reflection at a slightly smaller angle can be seen. The incorporation of Ca into the Sr phase causes the Sr reflection to migrate toward larger angles, whereas the Ca reflection migrates towards smaller angles as a result of the incorporation of Sr in the Ca phase.

Figure 8:
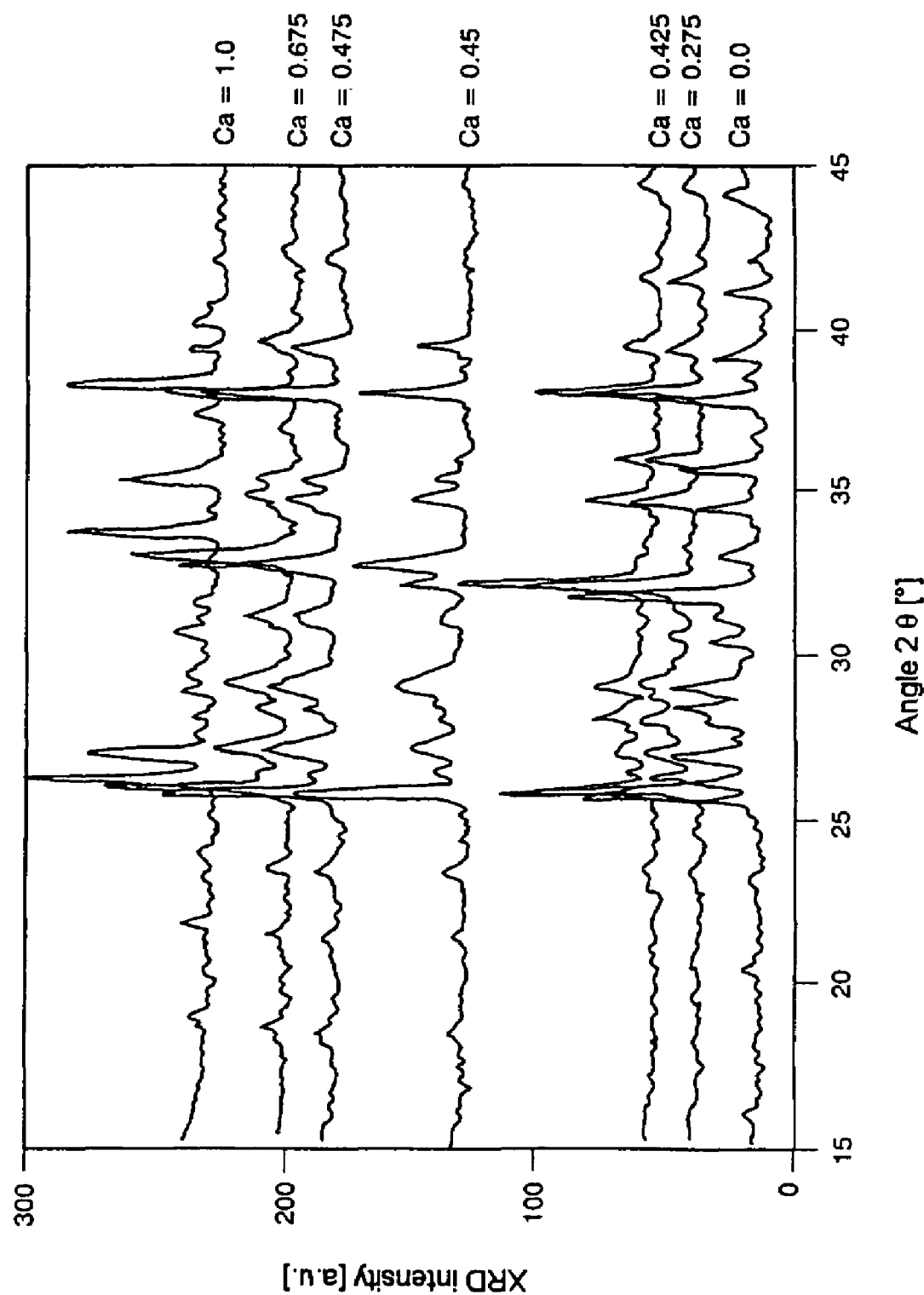
FIGS. 8 and 9 show enlarged illustrations of various regions of an XRD spectrum of a phosphor with different Ca contents.
Figure 9:
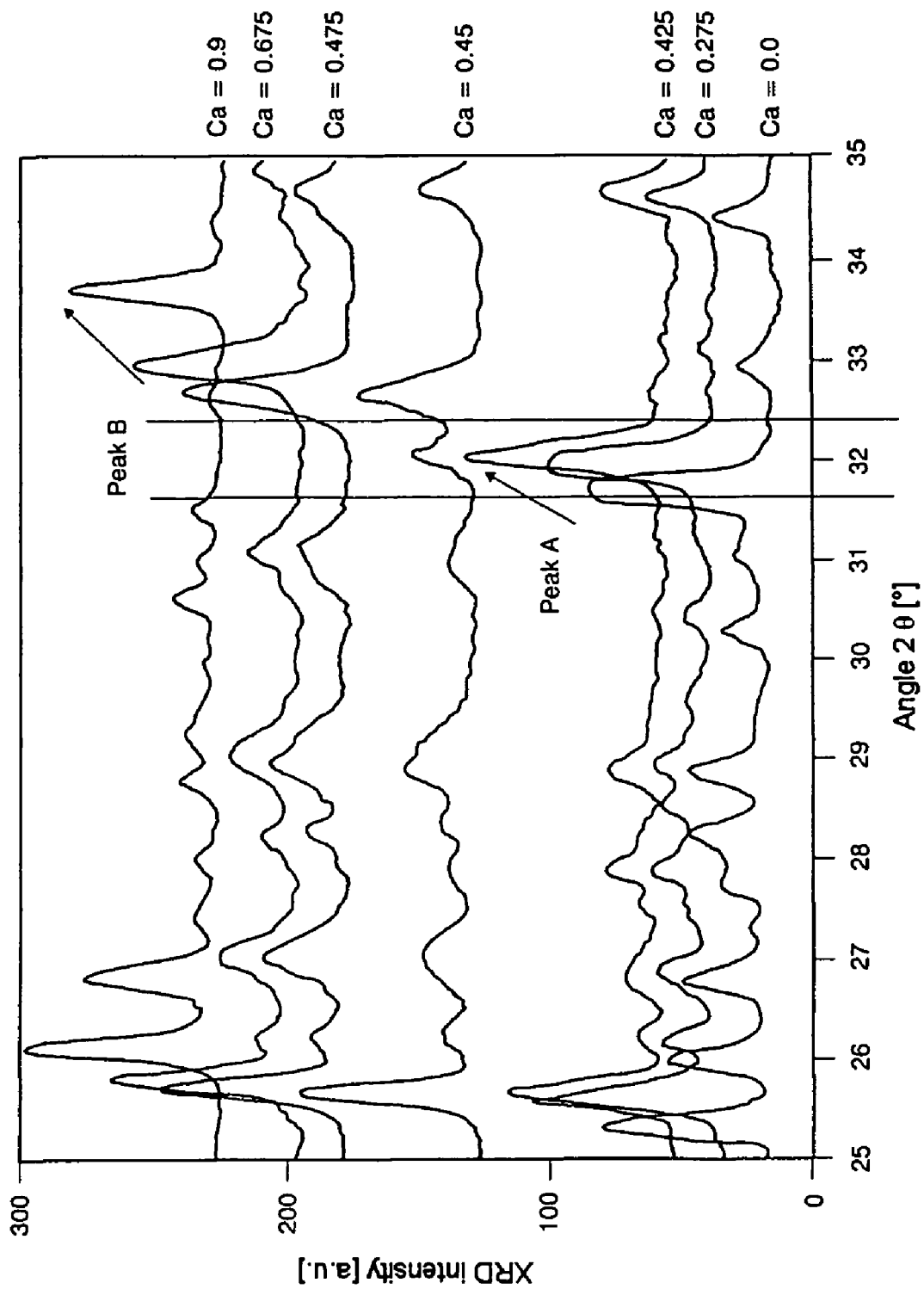

FIGS. 8 and 9 show detailed investigations. The excerpt presented in FIG. 8 shows the angle range from 15 to 45°, specifically for various mixed Sions with different Ca contents. The pure Sr Sion and Ca Sion are also included for comparison purposes. The incorporation of the Ca ion at the Sr site shifts the main lines toward smaller angles. This means that the lattice constants shrink. At the same time, numerous new lines, which in the literature are ascribed to the Ca Sion compound, increasingly occur, in particular above a Ca concentration of x>0.45. It can be inferred from this that the stable phase according to the invention is the Ca Sion phase which is already dominant in the mixed Sion.

FIG. 9 shows a further enlarged illustration of some reflections which are of particular interest. By way of example, the reflection indicated here by A is typical of Sr Sion, whereas

TABLE 1

| Sample | Composition | CIE-x | CIE-y | lambda_dom [nm] | No. |
|---|---|---|---|---|---|
| TF 27/04 | Sr0.95Eu0.05Si2N2O2 | 0.358 | 0.604 | 558 | 1 |
| TF 38/04 | Sr0.9Eu0.1Si2O2N2 | 0.387 | 0.536 | 563 | 2 |
| TF 61/04 | Sr0.945Ca0.005Eu0.05Si2N2O2 | 0.36 | 0.603 | 559 | |
| TF 62/04 | Sr0.94Ca0.01Eu0.05Si2N2O2 | 0.361 | 0.602 | 559 | |
| TF 63/04 | Sr0.9Ca0.05Eu0.05Si2N2O2 | 0.365 | 0.599 | 559 | |
| TF 54/04 | Sr0.675Ca0.275Eu0.05Si2N2O2 | 0.379 | 0.589 | 562 | 3 |
| TF 73/04 | Sr0.65Ca0.3Eu0.05Si2N2O2 | 0.379 | 0.589 | 562 | |
| TF 74/04 | Sr0.6Ca0.35Eu0.05Si2N2O2 | 0.381 | 0.587 | 562 | |
| TF 75/04 | Sr0.55Ca0.4Eu0.05Si2N2O2 | 0.383 | 0.586 | 562 | |
| TF 76/04 | Sr0.525Ca0.425Eu0.05Si2N2O2 | 0.383 | 0.586 | 562 | |
| TF 77/04 | Sr0.5Ca0.45Eu0.05Si2N2O2 | 0.383 | 0.583 | 563 | |
| TF 78/04 | Sr0.475Ca0.475Eu0.05Si2N2O2 | 0.383 | 0.581 | 562 | |
| TF 55/04 | Sr0.475Ca0.475Eu0.05Si2N2O2 | 0.384 | 0.58 | 562 | 4 |
| TF 56/04 | Sr0.275Ca0.675Eu0.05Si2N2O2 | 0.395 | 0.571 | 564 | 5 |
| TF 138/03 | Ca0.9Eu0.1Si2O2N2 | 0.445 | 0.563 | 571 | 6 |

Figure 5:
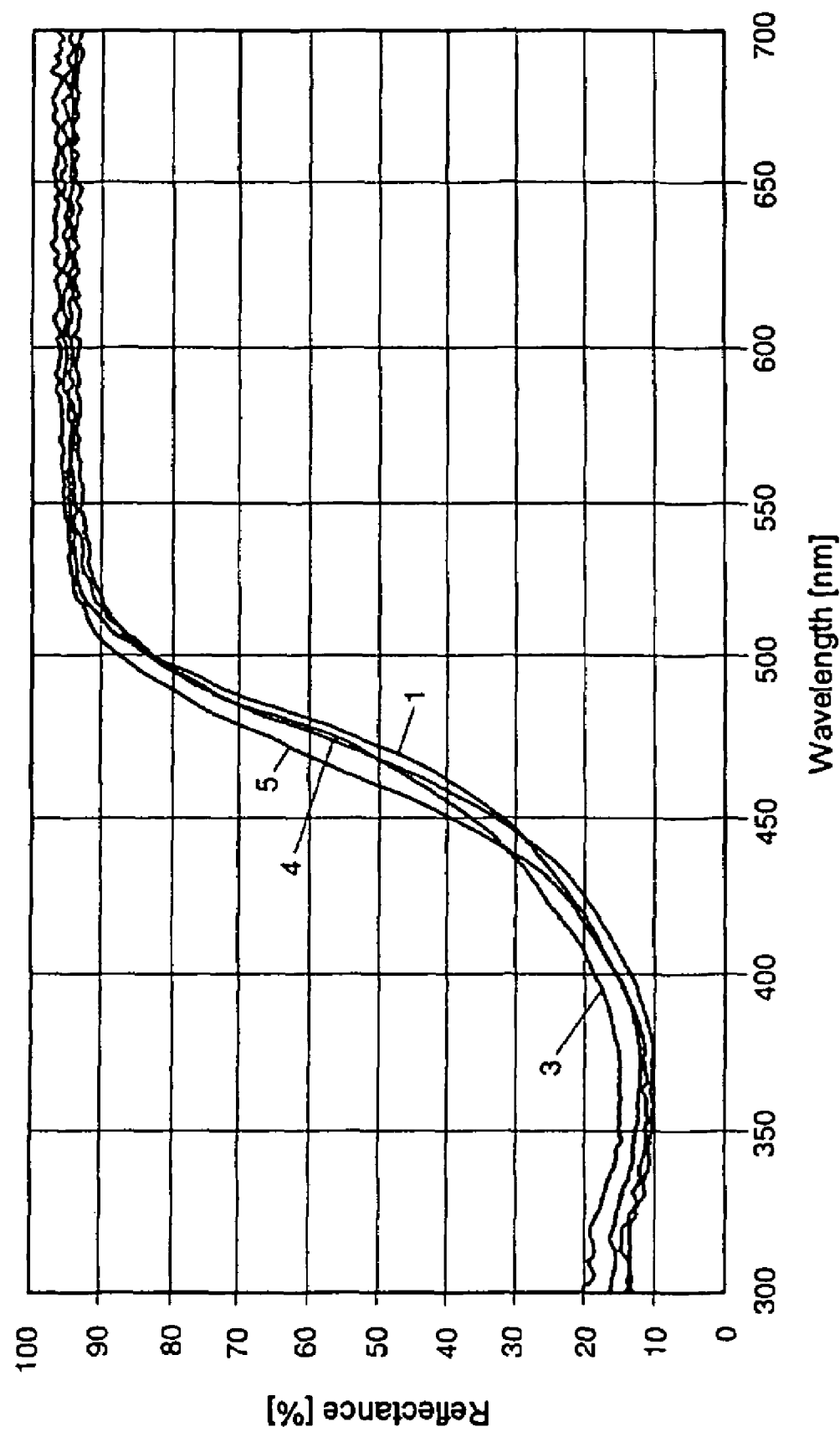
FIG. 5 shows a reflection spectrum of various oxynitridosilicates.

FIG. 5 shows that the reflectance spectra of the mixed Sions according to the invention also differ only slightly from that of the pure Sr Sion. The relationships are once again selected to correspond to those of Table 1.

Figure 6:
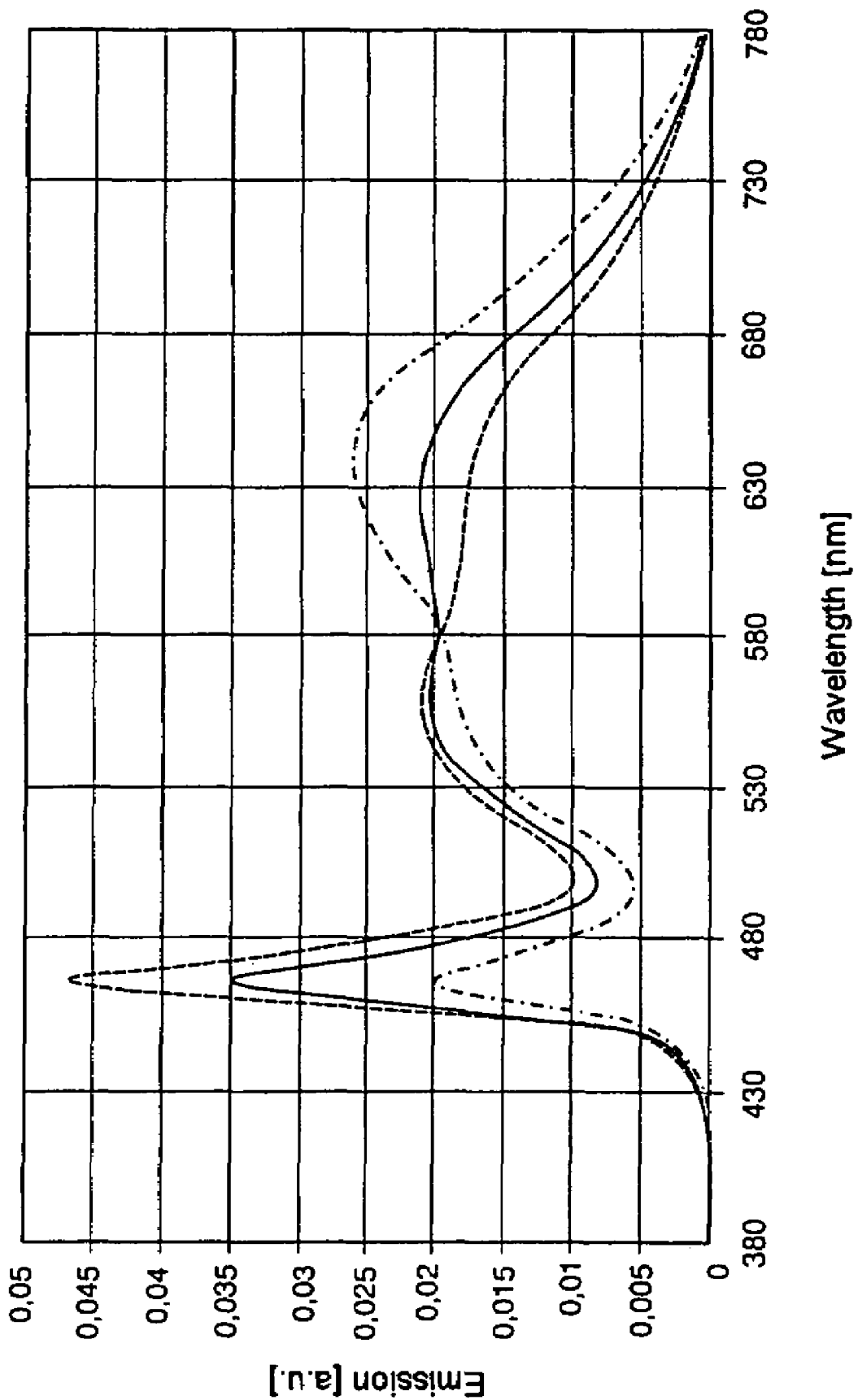
FIG. 6 shows the emission spectrum of various semiconductor components which serve as light source for white light.

FIG. 6 shows the LED spectrum for a white LED using a 1:1 mixed Sion and an Eu content of 5%, with the LED being adapted to a color temperature of 3000 K (curve a), 4000 K (curve b) and 5000 K (curve c). The associated Ra is in this case 94 or 90 or 88, respectively.

Figure 7A:
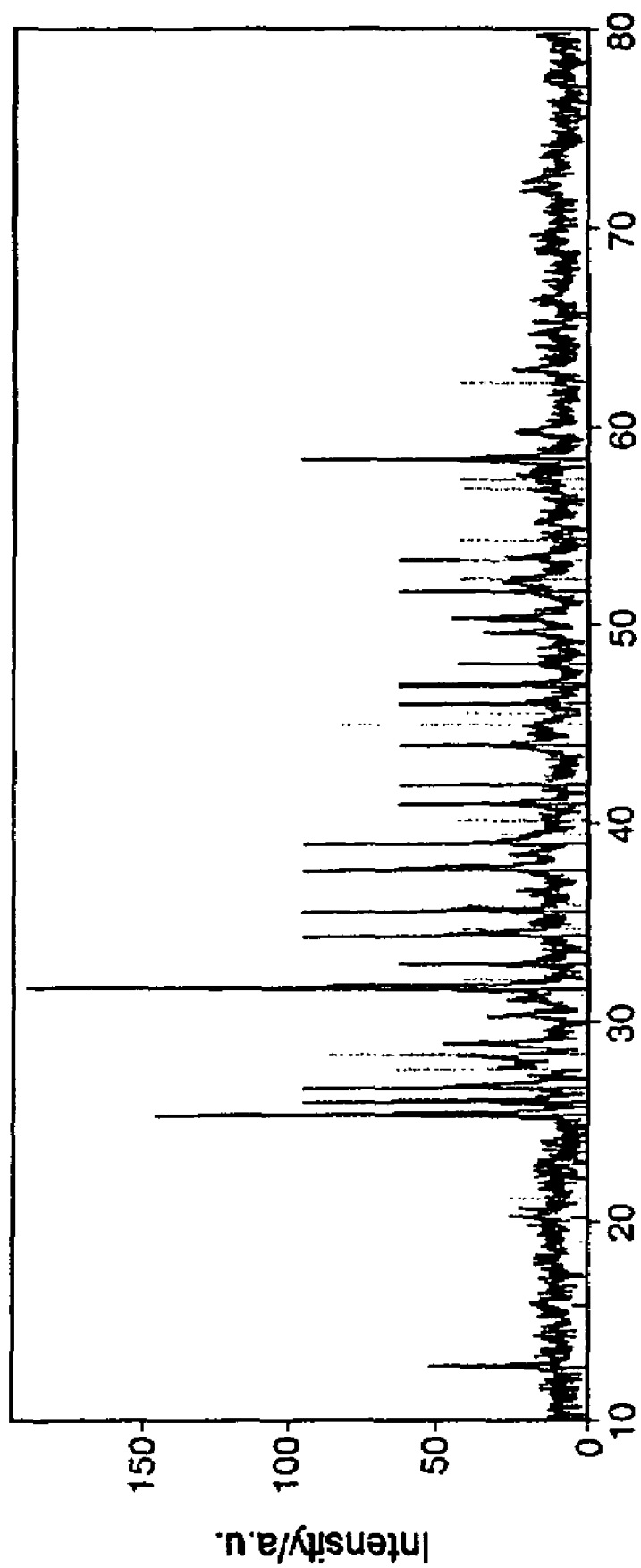
FIG. 7 shows an XRD spectrum for various phosphors (7a to 7c) with different Ca/Sr contents.
Figure 7B:
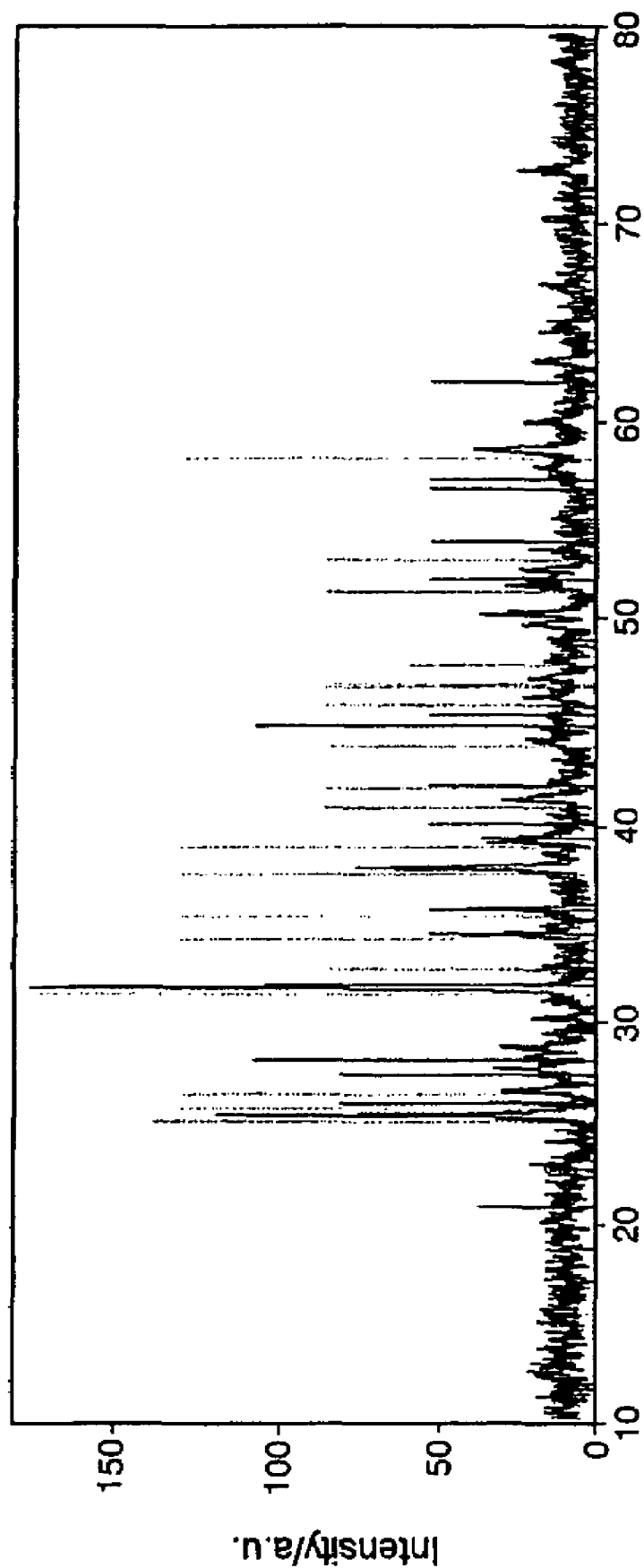
Figure 7C:
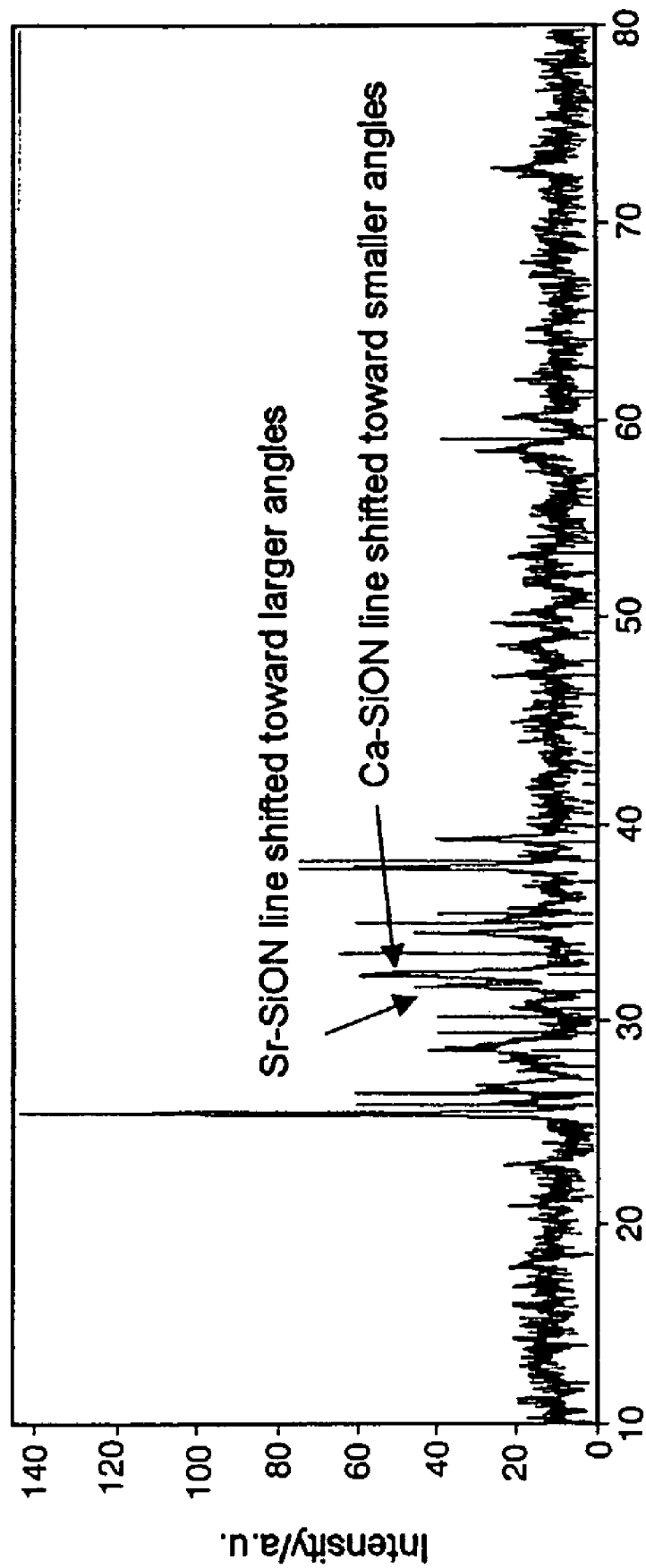

To improve understanding of the invention, FIG. 7 shows an XRD spectrum for various phosphors. The starting point is the Sr Sion (FIG. 7a), with its inherently unstable structure. By way of example, the reflection at approximately 13° is typical. It is noticeable that the introduction of relatively small quantities of Ca already leads to the structure, beyond a Ca content of approximately 47.5%, having the high stability of the Ca Sion. With regard to the stability, it is always necessary to take into account the Eu ion, and consequently the lower limit for the sum of Ca and Eu contents is approximately 30, in particular 32.5%. FIG. 7b shows an XRD spectrum for $Sr_{0.675}Ca_{0.275}Eu_{0.05}Si_2N_2O_2$, which has already changed into the stable configuration of the Ca Sion structure.

the reflection indicated by B is typical of Ca. Once the Sr reflection has been suppressed to only 40% or less of the height of the Ca reflection, the very high stability of the Ca Sion is also fully established for the mixed Sion.

Figure 10A:
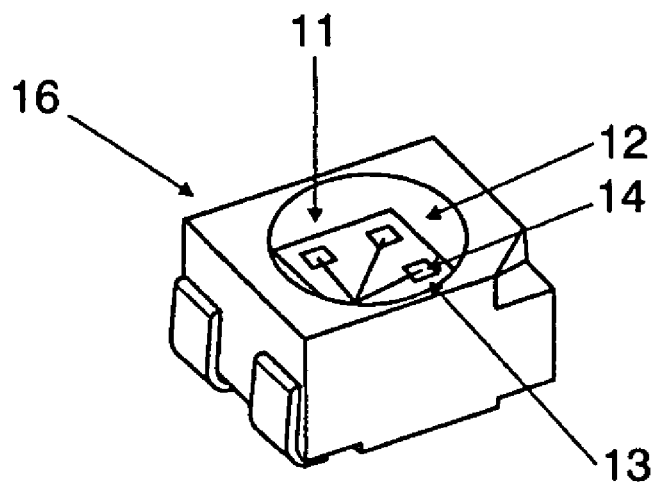
FIG. 10 shows an LED-based light source with various semiconductor components.
Figure 10B:
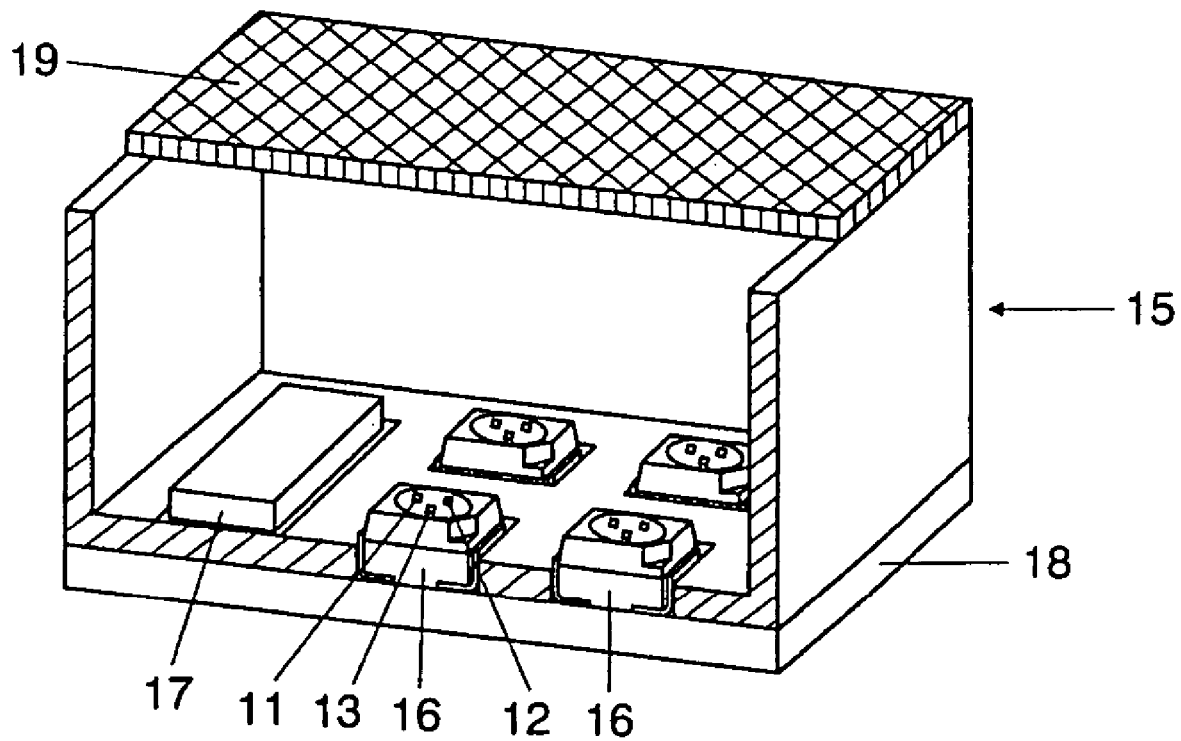

The structure of a further light source for white light is shown specifically in FIGS. 10a, 10b. The light source, cf. FIG. 10a, is a semiconductor component 16 of the LED type with a first chip 11 of type InGaN with a peak emission wavelength of, for example, 460 nm, and a second chip 12 of type InGaAlP with a peak emission wavelength of, for example, 620 nm, and finally a semiconductor component of the luminescence conversion LED type with a third chip 13 of type InGaN with a primary peak emission wavelength of, for example, 460 nm. The semiconductor component 16 together with other similar elements is embedded in an opaque basic housing 18 with side wall 15 and cover 19. The phosphor 14 is the oxynitridosilicate $(Sr_{0.45}Ca_{0.5}Eu_{0.05})Si_2O_2N_2$ which has been proposed as an exemplary embodiment which completely converts the primary radiation of the chip 13 into green radiation with a peak emission at 547 nm with $\lambda_{dom}$=563 nm. This solution has the major advantage that by changing the relative intensities of the three LEDs by electronic controller 17, it can be adjusted within a wide range of color temperatures.

The particular advantage of using a long-wave primary light source (450 to 465 nm) for the green luminescence conversion LED is that this avoids problems with ageing and degradation of housing and resin or phosphor, so that a long life is achieved.

In another exemplary embodiment, the primary light source used is a UV-LED (approximately 380 nm) for the green luminescence conversion LED, and in this case problems with ageing and degradation of housing and resin or phosphor have to be avoided as far as possible by additional measures which are known per se, such as careful selection of the housing material, addition of UV-resistant resin components. The major advantage of this solution is the very high efficiency of typically 30 lm/W which can thereby be achieved.

Figure 11:
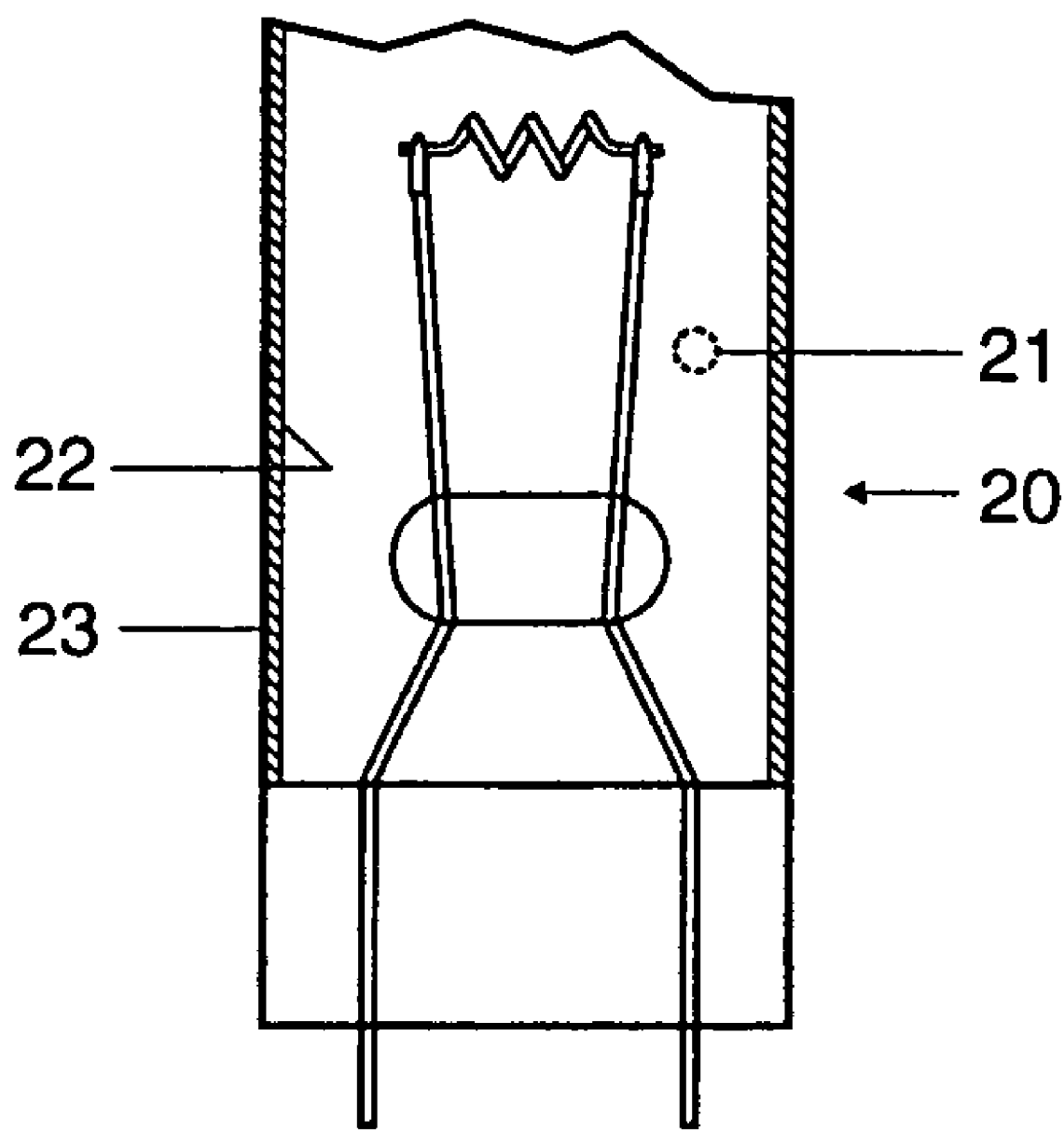
FIG. 11 shows a low-pressure lamp with an indium fill using an oxynitridosilicate.

FIG. 11 shows a low-pressure discharge lamp 20 with a mercury-free gas fill 21 (in diagrammatic form) which contains an indium compound and a buffer gas in accordance with WO 02/10374, with a layer 22 of oxynitridosilicate $(Sr_{0.45}Ca_{0.5}Eu_{0.05})Si_2O_2N_2$ having been applied to the inside of the bulb 23. The very particular advantage of this arrangement is that this oxynitridosilicate of the mixed Sion (Ca, Sr) type is ideally matched for indium radiation, since the latter has significant components in both the UV and the blue spectral regions, which are both absorbed equally well by this mixed Sion, making it superior to the known phosphors for this use. These known phosphors significantly absorb either only the UV radiation or the blue radiation of the indium, and consequently the indium lamp according to the invention has a significantly higher efficiency. This statement also applies to an indium lamp working on a high pressure basis as is known from U.S. Pat. No. 4,810,938.

The invention claimed is:

1. A light source having a primary radiation source, which emits radiation in the short-wave region of the optical spectral region in the wavelength range from 140 to 480 nm, this radiation being partly or completely converted into secondary radiation with a longer wavelength in the visible spectral region by means of at least one first phosphor; wherein the first phosphor is a highly efficient, stable oxynitride phosphor from the class of the oxynitridosilicates with a cation M and the empirical formula $MSi_2O_2N_2$; M simultaneously comprises as constituent Sr and Ca and also an activator D; D includes at least divalent europium; $M=Sr_{1-x-y}Ca_yEu_x$ where $0.3 \leq x+y \leq 0.725$, with a Ca/Eu ratio of >1; and the first phosphor has an emission with a dominant wavelength in the range from 555 to 568 nm.

2. The light source as claimed in claim 1, wherein the primary radiation source used is a light-emitting diode based on InGaN or InGaAlP or a discharge lamp working on a low pressure or high pressure basis or an electroluminescent lamp.

3. The light source as claimed in claim 1, wherein some of the primary radiation is also converted into radiation with a longer wavelength by means of a second phosphor.

4. The light source as claimed in claim 3, wherein some of the primary radiation is also converted into radiation with a longer wavelength by means of a third phosphor, this third phosphor emitting in the red spectral region.

5. The light source as claimed in claim 2, wherein the discharge lamp has an indium-containing fill.

6. The light source as claimed in claim 3, wherein the first and second phosphors are selected and mixed in a suitable way to generate white light.

7. The light source of claim 1, wherein M comprises between 1 and 20 mol % Eu.

8. The light source of claim 1, wherein M comprises between 2 and 12 mol % Eu.

9. The light source of claim 1, wherein y is $\geq 0.475$.

10. The light source of claim 1, wherein the Ca/Sr ratio is in the range 0.90<Ca/Sr<2.30.

11. The light source of claim 1, wherein the Ca/Sr ratio is in the range 0.95<Ca/Sr<1.20.

12. The light source of claim 1, wherein a part of Eu is replaced by Mn.

13. The light source of claim 1, wherein up to 30 mol % is replaced by Mn.

* * * * *